United States Patent [19]

Tilly et al.

[11] Patent Number: 5,013,111

[45] Date of Patent: May 7, 1991

[54] METHOD AND DEVICE FOR MOUNTING A LASER DIODE AND A LIGHT CONDUCTOR

[75] Inventors: Bodo Tilly, Grafing; Robert Rieger, Ostermuenchen, both of Fed. Rep. of Germany

[73] Assignee: Messerschmitt-Boelkow-Blohm GmbH, Munich, Fed. Rep. of Germany

[21] Appl. No.: 424,662

[22] Filed: Oct. 20, 1989

[30] Foreign Application Priority Data

Oct. 20, 1988 [DE] Fed. Rep. of Germany ....... 3835701

[51] Int. Cl.$^5$ ................................................ G02B 6/42
[52] U.S. Cl. ..................................... 350/96.2; 372/36
[58] Field of Search .......................... 350/96.20, 96.21; 357/74, 79, 81; 372/34, 36

[56] References Cited

U.S. PATENT DOCUMENTS

| 4,762,386 | 8/1988 | Gordon et al. | 350/96.20 |
| 4,895,424 | 1/1990 | Hughes | 350/96.20 |

FOREIGN PATENT DOCUMENTS

| 0181532 | 5/1986 | European Pat. Off. | 350/96.15 |
| 0094725 | 5/1984 | Japan | 350/96.17 |
| 0100408 | 6/1984 | Japan | 350/96.20 |

*Primary Examiner*—Frank Gonzalez
*Assistant Examiner*—Galen J. Hansen
*Attorney, Agent, or Firm*—W. G. Fasse; D. H. Kane, Jr.

[57] ABSTRACT

A laser diode in the form of a chip with a heat sink connected to an electronic control circuit, is positioned in front of a light conductor for emitting light into the light conductor. The light conductor (103), such as a fiber (101) of a glass fiber cable (102), passes through a hole in the wall of a housing (100) for the electronic control circuit. The light conductor end is precisely adjusted in the Z-direction of an X-Y-Z-coordinate system, and rigidly held in the adjusted position in a bore or slot (17a) of a mounting block (17). The laser diode (10) with its chip (11) and its heat sink (12) are held in a roughly adjusted position in a milled recess (17c) of the mounting block (17) relative to the tip of the light conductor by a compression leaf spring (14) which permits an adjustment of the laser diode with its chip and heat sink in the X- and Y-direction for a precise adjustment. A displacement gripper tongue mechanism is then used for a precise position adjustment in the X- and Y-direction. After the precise adjustment the laser diode with its chip and heat sink are spot welded by a laser beam to the mounting block. Preferably, a cooling body in heat transfer contact with the heat sink forms a unitary, integral, one piece structure with the mounting block.

7 Claims, 2 Drawing Sheets

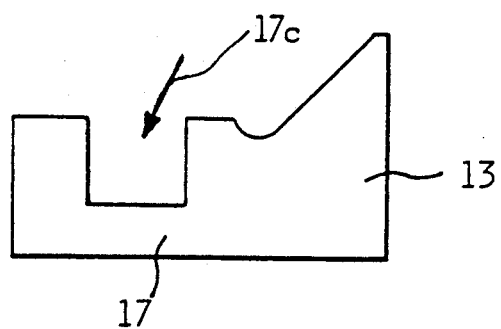
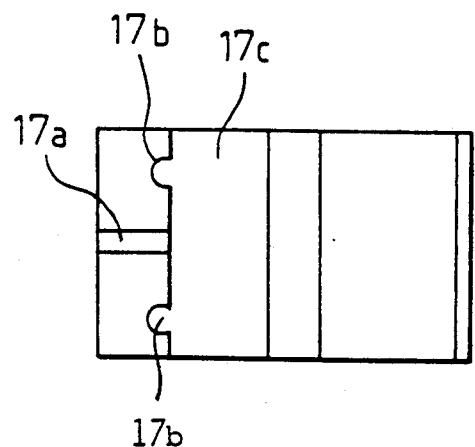

METHOD AND DEVICE FOR MOUNTING A LASER DIODE AND A LIGHT CONDUCTOR

FIELD OF THE INVENTION

The invention relates to a method and device for mounting a laser diode and a light conductor relative to each other so that they are aligned for light from the laser diode to enter into the light conductor.

BACKGROUND INFORMATION

Laser diodes of this type form part of a chip including a heat sink. These elements must be positioned for cooperation with a fixed light conductor fiber. Further, the laser diode must be connected to the electronic control circuits. Such laser diodes are well known and commercially available. However, conventional laser diodes require that their heat sink must be screwed to a cooling body, whereupon the resulting arrangements including the integrated electronic control circuit are enclosed in a housing and the glass fiber conductor or cable must be passed through a hole in the housing wall, only thereafter will the end of the light conductor fiber be so positioned that it is precisely aligned with the laser diode of the chip and then the so aligned light conductor fiber must be fixed in its adjusted or oriented position. The just outlined assembly steps pose difficulties because the very thin light conductor fiber requires adjustment in the three directions of a rectangular three-dimensional coordinate system having x-y- and z-coordinates. Additionally the relatively long fiber end which is held only at one location for the adjustment, and which is otherwise free to float requires that it is pinned down immediately after the fine adjustment relative to the diode in order to eliminate fiber oscillations that can be caused by vibrations of the device, by temperature changes, and so forth. Such a fine adjustment immediately followed by pinning down the adjusted fiber end is very involved and hence time consuming. As a result, where such devices are manufactured on an assembly line basis, the number of rejects is rather high and there is always the danger that the fiber which is now clamped down at two locations may be damaged, for example, due to high temperature variations.

Another problem is caused by the fact that the cable feed through into the housing must be reliably sealed in a vacuum tight manner by a laser welding after the final adjustment of the fiber position. Such a vacuum tight sealing has a tendency to ruin the prior adjustment so that steps must be taken to keep the glass fiber end in its adjusted position while the vacuum tight sealing is accomplished.

OBJECTS OF THE INVENTION

In view of the foregoing it is the aim of the invention to achieve the following objects singly or in combination:

to provide a device for the precise mounting of a laser diode and a light conductor relative to each other, whereby the efforts and expense for the adjustment of the two components is reduced as compared to the prior art;

to make sure that the positioning of the light conductor fiber is not subject to a redundant determination while assuring a reliable, rigid, and effective adjustment of the laser chip relative to the end of the glass fiber; and to provide for such a mounting of the fiber conductor that part of the required total adjustment can be made with the fiber light conductor while the remainder of the required adjustment can be made with the laser diode chip so that the required sealing of the light conductor cable lead-in can be accomplished prior to the completion of the adjustment.

SUMMARY OF THE INVENTION

According to the invention a laser diode and a light conductor are aligned relative to each other with reference to the X-Y-Z-coordinates of a three-dimensional coordinate system by a mounting block for holding the laser diode and the light conductor in an operational position relative to each other. The mounting block has a first recess with a longitudinal axis extending in the Z-direction of the three-dimensional coordinates for holding the light conductor in a fixed position relative to the Z-direction. The first recess can be a bore or a slot and means are provided for securing the light conductor fiber end in the bore or slot in a fixed position after adjustment in the Z-direction. A second recess in the mounting block defines a plane extending perpendicularly to the Z-direction and first members hold the laser diode in an adjustable position in the second recess in which the laser diode may first be roughly adjusted relative to the light conductor end. Second holding members permanently hold the laser diode in a fixed position after a fine adjustment in the X-Y-directions relative to the light conductor has been completed.

The laser diode is part of a chip which is combined with a heat sink and such an element is mounted for cooperation with a light conductor by the following steps according to the invention. First, the light conductor is secured with its free end in a mounting block in a fixed position in the Z-direction of a three-dimensional coordinate system having X-Y-Z-coordinates. Second, the laser diode is adjustably held with its chip and heat sink in a recess of the mounting block in such a way that the laser diode is adjustable relative to the X- and Y-direction, but not relative to the Z-direction. Third, the laser diode with its chip and heat sink is adjusted in the X- and Y-direction into a precise position for emitting light from the laser diode into the light conductor. In the last step the laser diode with its chip and heat sink are secured in the adjusted position to the mounting block, preferably by a laser spot welding operation which simultaneously secures the chip to the heat sink and the heat sink to a heat removing body which may, preferably, be a single integral structure with the mounting block. The insertion of a light conductor cable, of which the light conductor is a part, through a hole in a housing wall, will normally precede the above steps.

BRIEF DESCRIPTION OF THE DRAWINGS

In order that the invention may be clearly understood, it will now be described, by way of example, with reference to the accompanying drawings, wherein:

FIG. 2 is a side view onto the combined mounting block and heat removal body; and FIG. 2a is a top plan view onto the mounting block and heat removing body of FIG. 2.

Figure 1:
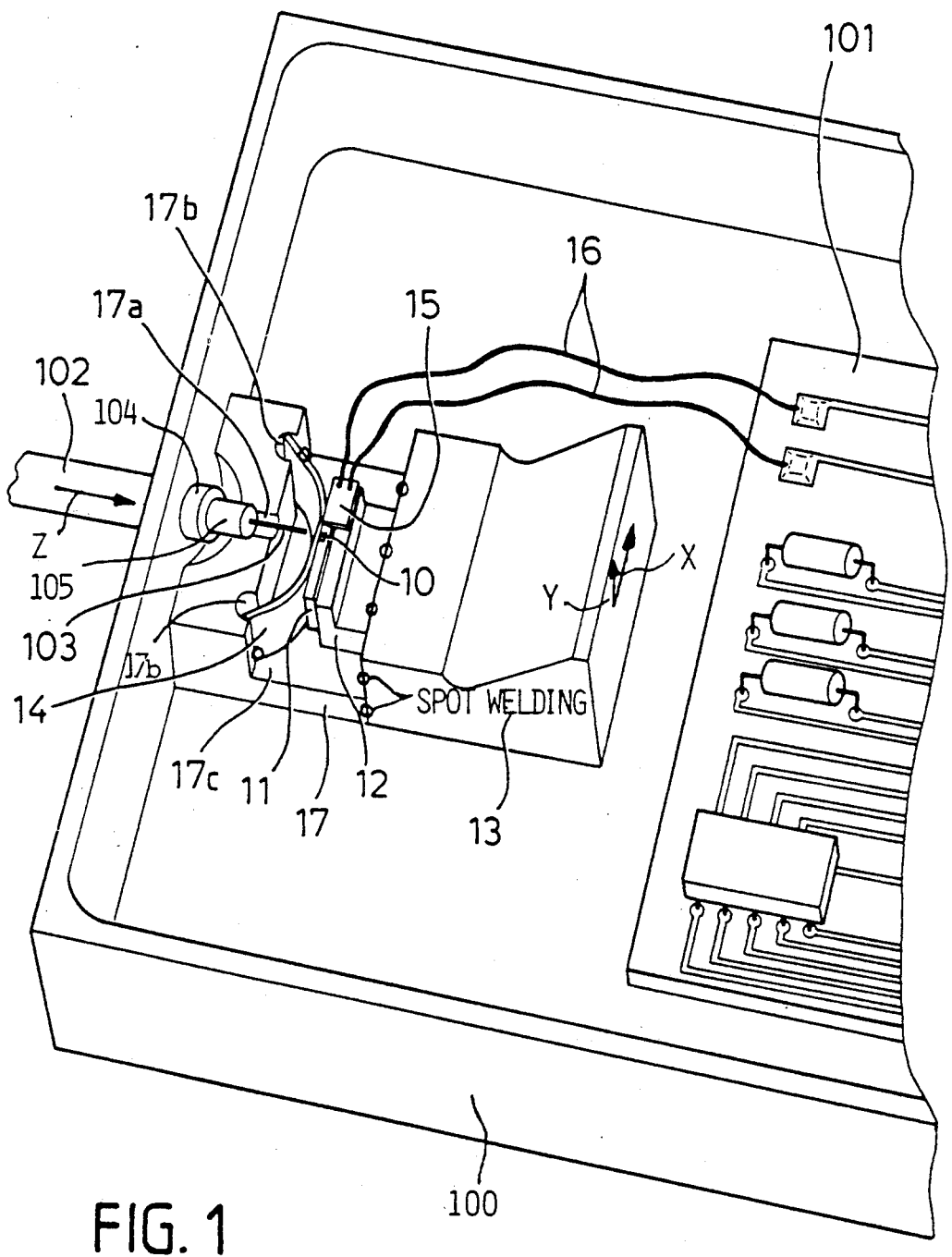
FIG. 1 shows an example embodiment of a mounting according to the invention in a perspective illustration in a housing which also contains the electronic control circuit.

DETAILED DESCRIPTION OF PREFERRED EXAMPLE EMBODIMENTS AND OF THE BEST MODE OF THE INVENTION

FIG. 1 shows the present mounting in a housing 100 also containing an electronic control circuit 101. A side wall of the housing 100 has a lead-through bore 104 through which a light conductor cable 102 including a light conducting fiber 103, is inserted and sealed in a hermetic manner. The sealing of the cable 102 in the bore 104 is not part of the invention. An insulation jacket 105 of the light conductor cable is removed sufficiently to provide the free end of the light conductor 103. However, sufficient insulation is left for securing the free end of the light conductor 103 in a relatively precise position in the Z-direction opposite a laser diode 10. The Z-direction is part of a three-dimensional coordinate system having the coordinates X, Y, and Z as shown in FIG. 1.

According to the invention, a mounting block 17 is provided with a first recess 17a having a longitudinal axis extending in the Z-direction for receiving and tightly holding the insulation jacket 105 of the light conductor fiber 103. The first recess is a bore or a slot 17a, in which the cut-back end of the jacket 105 is held so that the free end of the light conductor fiber 103 is supported in cantilever fashion. Such a cantilever type support is capable of taking up heat expansions without applying tension to the free end of the fiber conductor 103, whereby the operability of the electronic control circuit 101 is not adversely influenced. This is possible because it has been found that the alignment of the free end of the light conductor 103 relative to the laser diode 10 in the Z-direction is not so critical as the alignment in the X- and Y-directions.

The mounting block 17 also has a second recess 17c which extends at right angles relative to the Z-direction, in other words, in parallel to the plane defined by the X-Y-coordinates. The laser diode 10 is part of a chip 11 which is located in heat transfer contact with a heat sink 12 having preferably an L-shaped cross-sectional configuration or an angular cross-sectional configuration fitting into the recess 17c. The chip 11 carries a soldering board 15 to which the ends of the conductor wires 16 are soldered. The wires 16 lead to respective soldering points in the electronic control circuit 101. The unit formed by the chip 11 with its laser diode 10 and the heat sink 12 including the soldering board 15 is received in the recess 17c which may be milled into the mounting block 17 made preferably of copper. A cooling body 13 is either a separate element or an element integral with the mounting block, and is in both instances in heat transfer contact with the mounting block 17 and with the heat sink 12.

A leaf spring 14 anchored with its ends in grooves 17b of the mounting block 17c is so dimensioned and deformed by its anchoring that a biasing force in the Z-direction is exerted on the chip 11 and the heat sink 12 to initially hold these elements in the recess 17c in an adjustable manner for adjustment in the X-Y-directions. The grooves 17b are milled into the mounting block 17 either as round bottomed grooves or as square edged grooves. Due to the biasing force in the Z-direction, the chip 11 and the heat sink 12 are not adjustable in the Z-direction anymore, but are movable in the X-Y-direction, for example, by a conventional gripper tongue tool not shown.

The fine or precise adjustment of the elements 11 and 12 in the X-Y-directions is performed with the aid of such a gripper tongue tool not shown, but capable of positioning the elements 11 and 12 into the precisely required position for alignment with the free end of the light conductor 103. Once this adjustment is completed, the elements 11 and 12 are fixed in position by second holding elements, for example, in the form of spot weldings made by a laser beam. Thus, the elements 11 and 12 are permanently held in the adjusted position and are simultaneously welded to the heat removal body 13. The mounting block 17 and the cooling body 13 are conventionally secured in the housing 100.

FIGS. 2 and 2a show the integral construction of the mounting block 17 with the cooling body 13, thus forming a single piece, for example, of copper.

The just described embodiment of the invention has a number of advantages. The lead-through bore 104 for the light conductor glass fiber cable 102 does not require any particular adjustment and once the free end of the light conductor fiber 103 is properly located in the Z-direction, the lead-through can be easily sealed in a gas-tight hermetic manner. This mounting of the light conductor cable substantially simplifies the adjustment of the light conductor fiber in but one direction. Further, the adjustment of the chip 11 and heat sink 12 in the plane defined by the X- and Y-coordinates, is also simplified since an adjustment in the Z-direction is no longer necessary. These features of the invention have substantially reduced the number of rejects and the time needed for the assembly has also been reduced.

Although the invention has been described with reference to specific example embodiments it will be appreciated that it is intended to cover all modifications and equivalents within the scope of the appended claims.

What we claim is:

1. A device for mounting and aligning a laser diode and a light conductor relative to each with reference to the X-Y-Z coordinates in space, comprising a laser diode device and a light conductor having a light conducting fiber (103) in a jacket (105) and a free fiber end extending out of said jacket, a mounting block for holding said laser diode device and said light conductor with its jacket in an operational position relative to each other, said mounting block having a first recess (17a) with a longitudinal axis extending in the Z-direction of said coordinates for holding said light conductor with its jacket in a fixed position relative to said Z-direction without applying tension to said free fiber end of said light conductor, and a second recess (17c) in said mounting block, said second recess defining a plane extending perpendicularly to said Z-direction, a leaf spring (14) mounted in said second recess (17c) and bearing against said laser diode device for initially holding said laser diode device in said second recess (17c) in said operational position after adjustment of said laser diode device in an X-Y-direction relative to said light conductor, and laser spot weldings permanently holding said laser diode device in said operational position relative to said light conductor fiber end for introducing light from said laser diode into said free fiber end of said light conductor.

2. The device of claim 1, wherein said laser diode device comprises a chip (11), a laser diode on said chip, and a heat sink (12), wherein said mounting block comprises a cooling body (13) in heat transfer contact with said heat sink (12), said leaf spring (14) holding said chip

(11) with its laser diode (10) and said heat sink (12) prior to said adjustment of said laser diode device relative to said free end of said light conductor, said laser spot weldings permanently holding said chip (11) with its laser diode (10) and said heat sink (12) in said operational position and in heat transfer contact with said cooling body (13).

3. The device of claim 2, wherein said leaf spring comprises a curved leaf spring for applying compression to said chip, said mounting block further comprising grooves (17b) in a side wall of said recess (17c), said curved leaf spring having ends received in said grooves (17b) for biasing a surface portion of said curved leaf spring against said chip for holding said chip with its heat sink.

4. The device of claim 1, wherein said laser diode device (10, 11) further comprises a soldering junction support plate (15) for supporting soldered junctions of connecting wires (16) of electronic circuit means (101).

5. The device of claim 1, further comprising a cooling body (13) in heat transfer contact with said laser diode device (10, 11), said mounting block (17) and said cooling body (13) forming an integral single copper piece, said second recess (17c) being formed in said single copper piece.

6. A method for mounting a laser diode device including a laser diode, a chip and a heat sink in a position for cooperation with a light conductor having a light conducting fiber in a jacket and a free fiber end extending out of said jacket, comprising the following steps:
   (a) securing said light conductor with its jacket in a mounting block in a fixed position in the Z-direction of a three-dimensional coordinate system having X-Y-Z-coordinates, and so that said free end of said light conducting fiber is supported in cantilever fashion without applying any tension to said free end of said light conducting fiber.
   (b) initially holding said laser diode device and its chip and heat sink with a spring force in a recess of said mounting block in such a way, that said laser diode device, its chip and its heat sink are adjustable relative to the X- and Y- direction against said spring force but not relative to the Z-direction,
   (c) adjusting said laser diode device, its chip and its heat sink in the X- and Y-direction into an adjusted operational position for emitting light from said laser diode into said light conductor, and
   (d) laser spot welding said laser diode device, its chip and its heat sink in said adjusted position to said mounting block.

7. An apparatus for mounting and aligning a laser diode and a light conductor relative to each other with reference to the X-Y-Z-coordinates in space, comprising a laser diode device including said laser diode and a light conductor having a light conducting fiber (103) in a jacket (105) and a free fiber end extending out of said jacket, a mounting block for holding said laser diode device and said jacket of said light conductor, said mounting block having a first recess (17a) with a longitudinal axis extending in the Z-direction of said coordinates for holding said jacket of said light conductor in said recess in a fixed position relative to said Z-direction and so that said free fiber end extends in cantilever fashion toward said laser diode so that said free fiber end is free to move outside its jacket without applying any tension to said free fiber end, and a second recess (17c) in said mounting block, said second recess defining a plane extending perpendicularly to said Z-direction, spring force applying means (14) for initially holding said laser diode device in said second recess (17c) after an adjustment of said laser diode device relative to said free fiber end of said light conductor, and laser spot weldings permanently holding said laser diode device in a fixed X-Y-position relative to said free end of said light conductor for introducing light from said laser diode into said free fiber end of said light conductor.

* * * * *

UNITED STATES PATENT AND TRADEMARK OFFICE
CERTIFICATE OF CORRECTION

PATENT NO. : 5,013,111

DATED : May 7, 1991

INVENTOR(S) : Bodo Tilly et al.

It is certified that error appears in the above-identified patent and that said Letters Patent is hereby corrected as shown below:

In claim 1, Column 4, line 39, replace "to each" by
--to each other--.

Signed and Sealed this

Eighth Day of September, 1992

Attest:

DOUGLAS B. COMER

*Attesting Officer*  *Acting Commissioner of Patents and Trademarks*